United States Patent [19]
Hovel et al.

[11] Patent Number: 4,592,793
[45] Date of Patent: Jun. 3, 1986

[54] PROCESS FOR DIFFUSING IMPURITIES INTO A SEMICONDUCTOR BODY VAPOR PHASE DIFFUSION OF III-V SEMICONDUCTOR SUBSTRATES

[75] Inventors: Harold J. Hovel, Katonah; Thermon E. McKoy, Peekskill, both of N.Y.

[73] Assignee: International Business Machines Corporation, Armonk, N.Y.

[21] Appl. No.: 712,300

[22] Filed: Mar. 15, 1985

[51] Int. Cl.$^4$ ........................................... H01L 21/223
[52] U.S. Cl. ................................... 148/189; 148/188; 252/951
[58] Field of Search ................. 148/188, 189; 252/951

[56] References Cited

U.S. PATENT DOCUMENTS

| | | | |
|---|---|---|---|
| 3,374,125 | 3/1968 | Goldsmith | 148/189 |
| 3,530,016 | 9/1970 | Joseph | 148/189 |
| 3,852,128 | 12/1974 | Kreuzer | 148/189 |
| 3,923,563 | 12/1975 | Venkatu | 148/189 |
| 3,943,016 | 3/1976 | Marcotte | 148/189 |
| 3,948,696 | 4/1976 | Inaniwa et al. | 148/189 |
| 3,961,996 | 6/1976 | Namizaki et al. | 148/171 |
| 3,984,263 | 10/1976 | Asao et al. | 148/1.5 X |
| 4,124,417 | 11/1978 | Sirot et al. | 148/189 |
| 4,239,560 | 12/1980 | Chang et al. | 148/189 |
| 4,300,960 | 11/1981 | Koike et al. | 148/171 |
| 4,312,681 | 1/1982 | Rupprecht et al. | 148/175 X |
| 4,348,428 | 9/1982 | Rockley et al. | 148/188 X |
| 4,544,417 | 10/1985 | Clarke et al. | 148/175 X |

*Primary Examiner*—George T. Ozaki

[57] ABSTRACT

A process for diffusing a dopant into a III-V type semiconductor body is disclosed which comprises:

(a) placing in a heating chamber which is substantially devoid of any oxidizing substance a deposition substrate possessing a dopant-containing layer which has been vapor deposited upon a major surface thereof in contact with, or in the proximity of, an object substrate fabricated from a III-V type semiconductor material with the dopant-containing layer of the deposition substrate being substantially opposed to a major surface of the object substrate;

(b) introducing into the heating chamber a source of Group V element corresponding to the Group V element of the object substrate, said source being capable of providing Group V element in the vapor phase at the diffusion temperature with the vapor pressure of the vapor phase Group V element being at or above the equilibrium vapor pressure of the Group V element present at the surface of the object substrate; and, (c) heating the deposition substrate and the object substrate to the diffusion temperature for a period of time sufficient to diffuse a predetermined amount of dopant into the object substrate to a predetermined depth therein.

22 Claims, No Drawings

PROCESS FOR DIFFUSING IMPURITIES INTO A SEMICONDUCTOR BODY VAPOR PHASE DIFFUSION OF III–V SEMICONDUCTOR SUBSTRATES

DESCRIPTION

1. Technical Field

The present invention relates to a process for diffusing impurities, or dopants, into semiconductor bodies. More particularly, the invention relates to a process for diffusing a P-type or N-type dopant species into a semiconductor wafer fabricated from a compound of a Group III element and a Group V element (a "III–V" type semiconductor material) such as gallium arsenide (GaAs).

2. Prior Art

Semiconductors are widely used in the construction of a variety of electronic devices including rectifiers, bipolar transistors, field effect transistors, diodes, photodiodes, solar cells, semiconductor lasers, charged particle collectors, and so on. While semiconductor bodies can be circular, rectangular, triangular or any other convenient shape, they are typically in the form of a wafer or disk.

Manufacturing processes for producing semiconductor devices employ one or more diffusion steps in which an impurity, or dopant, is diffused into a semiconductor body under carefully controlled conditions to produce different conductivity layers of predetermined dimensions. A zone of semiconductor material containing an excess of acceptor impurities resulting in a deficit of electrons or an excess of "holes" is said to exhibit P-type activity while a zone containing an excess of donor impurities and yielding an excess of free electrons is said to exhibit N-type activity. Common P-type dopant species include zinc, cadmium and beryllium. Among the frequently employed N-type dopant species are silicon, tellurium, selenium and sulfur. Illustrative of known diffusion processes are those disclosed in U.S. Pat. Nos. 3,374,125; 3,530,016; 3,852,128; 3,923,563; 3,943,016; 3,948,696; 3,961,996; 4,239,560; and 4,300,960.

In one type of diffusion process which is particularly effective for silicon semiconductors, a dopant-containing oxide glass is deposited on the semiconductor body to provide a "sandwich" which is then heated to the diffusion temperature thereby causing dopant to migrate from the oxide glass layer and diffuse into the semiconductor body. Following diffusion, the oxide layer is removed from the doped semiconductor. This procedure is not entirely suitable for doping III–V type semiconductors since it is very difficult to properly remove the oxide layer following diffusion and precise control of dopant concentration in the semiconductor body is not readily achieved.

In another type of diffusion procedure, a dopant source which can be a semiconductor body cut from a single crystal grown with the dopant species either uniformly distributed throughout (an "infinite source") or restricted to a layer at the surface thereof (a "finite source") as in the process of U.S. Pat. No. 3,530,016, is placed in proximity to the semiconductor body to be doped in a diffusion oven. Heating to the diffusion temperature, preferably in the presence of an inert gas, results in diffusion of dopant from the source to the undoped semiconductor body. While a procedure of this type is useful for doping semiconductor materials which do not decompose at the elevated temperatures characteristic of diffusion processes, e.g., silicon, it cannot be readily practiced without modification upon semiconductor materials which break down at these temperatures, namely, those based on compounds of a Group III element and a Group V element such as gallium arsenide. At ordinary diffusion temperatures, gallium arsenide semiconductor bodies will undergo dissociation or decomposition at their surfaces giving off elemental arsenic. Loss of arsenic (or other Group V element, in the case of other kinds of III–V type semiconductor materials) from the semiconductor body will result in an alteration of the surface composition of the semiconductor and as a consequence, will fail to provide an acceptable product.

When it is desired to diffuse a dopant into the latter type of semiconductor material, it is necessary to conduct the process in a diffusion atmosphere containing a Group V element in the vapor phase which is identical to the Group V element of the semiconductor. By carrying out the process under conditions which will provide a vapor pressure of the Group V element present in the diffusion atmosphere at a level at least equal to the equilibrium vapor pressure of the Group V element at the surface of the semiconductor body, loss of Group V element from the semiconductor body can be prevented and the initial composition of the surface of the semiconductor body will be preserved. Heretofore, in order to accomplish this, it has been necessary to resort to the use of an evacuated closed quartz tube containing a dopant source and Group V element at one end of the tube and a semiconductor body at the other end. The closed tube is placed in a two-zone diffusion furnace or chamber with the mixture of dopant and Group V element at the one end of the tube being heated in the first zone of the furnace to a temperature at which predetermined quantities of the dopant species and the Group V element will migrate into the tube atmosphere. Meanwhile, the semiconductor body at the other end of the tube is heated in the second zone of the furnace to a temperature at which diffusion of the dopant species from the tube atmosphere into the semiconductor body will be effected. At the conclusion of this diffusion procedure, the so-called "closed tube" diffusion process, the tube is destroyed to allow for the removal of the doped semiconductor body.

In practice, the foregoing process requires a fairly high level of technical skill to be carried out successfully. In addition, the quartz tube used by the process (and in other types of closed tube diffusion processes such as the one disclosed in U.S. Pat. No. 3,852,128) is relatively expensive and of necessity must be destroyed after only a single use adding still further to the cost of the process. Yet another disadvantage of this process lies in the tendency of the operation by which the tube is sealed, i.e., application of intense, localized heat to the designated end portion of the tube to collapse the tube wall in the heated area upon itself, to result in contamination of the semiconductor which is to be doped. Naturally occurring impurities present in the quartz which are given off when the quartz is heated to the softening point can diffuse into the semiconductor material altering its composition to an unacceptable extent.

While open tube diffusion processes such as that disclosed in U.S. Pat. No. 4,239,560 are more economical to carry out than the closed tube processes, they are not suitable where the III–V type semiconductor materials are concerned due to the aforementioned propensity of such materials to undergo decomposition at the temperatures required to effect diffusion.

SUMMARY OF THE INVENTION

It is an object of the present invention to provide a comparatively simple and economical diffusion process for introducing a P-type or N-type dopant into a semiconductor body of the III-V type.

It is further an object of the present invention to provide a diffusion process for III-V type semiconductor bodies which avoids the disadvantages of known closed tube type processes such as that described above.

It is still another object of the invention herein to provide a versatile, open tube process which makes surface concentration of the desired dopant species independent of the temperature required to effect diffusion, which is capable of high throughput levels, which offers wide flexibility in surface concentration of dopant and which is "clean", i.e., substantially free of unwanted contamination from the diffusion source.

These and other objects are achieved by the process of the present invention for diffusing a dopant into a III-V type semiconductor body which comprises:

(a) placing in a heating chamber which is substantially devoid of any oxidizing substance a deposition substrate possessing a dopant-containing layer which has been vapor deposited upon a major surface thereof in contact with, or in the proximity of, an object substrate fabricated from a III-V type semiconductor material with the dopant-containing layer of the deposition substrate being substantially opposed to a major surface of the object substrate;

(b) introducing into the heating chamber a source of Group V element corresponding to the Group V element of the object substrate, said source being capable of providing Group V element in the vapor phase at the diffusion temperature with the vapor pressure of the vapor phase Group V element being at or above the equilibrium vapor pressure of the Group V element present at the surface of the object substrate; and, (c) heating the deposition substrate and the object substrate to the diffusion temperature for a period of time sufficient to diffuse a predetermined amount of dopant into the object substrate to a predetermined depth therein.

Like the more economical and operationally simpler open tube diffusion processes known in the art, the diffusion process of this invention need not be practiced in a vacuum and does not require a costly single-use quartz tube. A furnace having only a single heating zone and which is capable of providing the temperature levels required for diffusion is essentially the only major equipment needed to carry out the process successfully. In addition to its relative simplicity and efficiency and its ability to provide fairly high levels of throughput, the diffusion process of this invention is remarkably clean providing a doped semiconductor body containin9 little, if any, undesirable contamination.

DETAILED DESCRIPTION OF THE PREFERRED EMBODIMENTS OF THE INVENTION

The source of impurities, or dopant, to be diffused into a semiconductor body in accordance with this invention is referred to herein as the "deposition substrate" and frequently will be provided in the form of a wafer having dimensions of, for example, from about 2 to about 10 centimeters in diameter and from about 0.05 to about 1.0 millimeters in thickness. Since its essential function is to serve as a carrier or source of dopant, the deposition substrate can be prepared from a wide variety of materials. Thus, the deposition substrate can be made of the same material as the semiconductor body to be doped, e.g., gallium arsenide (GaAs), some other crystalline material, e.g., alumina ($Al_2O_3$), germanium (Ge) or zinc selenide (ZnSe), etc., or non-crystalline material, e.g., graphite (C), or it can even be fabricated from a metal such as tungsten (W).

The deposition substrate possesses a layer of material which has been vapor deposited upon a major surface and which contains the desired concentration of dopant. This layer will be of the same material as the semiconductor body which is to undergo doping, referred to herein as the "object substrate." Thus, like the object substrate, the dopant-bearing layer on the deposition substrate will be made up of a III-V type semiconductor material, i.e., a compound of at least one Group III element, namely, boron (B), aluminum (Al), gallium (Ga) and/or indium (In), and at least one Group V element, which is to say, nitrogen (N), phosphorus (P), arsenic (As) or antimony (Sb). Examples of such materials from which the dopant-containing layer can be made, and therefore examples of materials from which the object substrate can be made, include GaAs, InAs, GaInAs, AlAs, GaAlAs, InP, GaP, GaInP, GaInAsP and GaAlP. Good results have been obtained with the material of choice, GaAs. The layer together with a desired amount of dopant species is conveniently applied to the deposition substrate employing known and conventional vapor deposition techniques, for example, the procedure described by P. D. Dapkas, et al. in *Journal of Crystal Growth*, Vol. 55, p. 10 et seq. (1981), the disclosure of which is incorporated by reference herein. For example, a grown layer of GaAs containing zinc (Zn) dopant, a P-type impurity, can be applied to a deposition substrate by introducing a homogeneous mixture of trimethyl gallium ($Ga(CH_3)_3$), arsine ($AsH_3$) and diethyl zinc ($Zn(CH_2CH_3)_2$) into a furnace containing the substrate(s) and heating to 650°-700° C. in the presence of hydrogen as a carrier gas until such time as the desired thickness of zinc-containing GaAs is deposited upon the substrate. Mole ratios of arsine to trimethyl gallium on the order of 20:1 are commonly employed. The concentration of diethyl zinc will, of course, determine the concentration of zinc dopant in the grown layer. Heating for a period of from 10 to 30 minutes is generally sufficient to provide a grown layer thickness of from about 1 to about 5 microns containing the dopant uniformly distributed therein. If desired, the grown layer can be applied to the deposition substrate, or susceptor, in a pattern using conventional masking procedures in which event dopant will diffuse into the object substrate in the indentical pattern. The surface concentration of the dopant species present in the diffused layer will be one half the amount of dopant contained in the grown layer on the deposition substrate. Concentrations of dopant in the grown layer can be varied widely and can be from about $10^{17}$ to about $10^{20}$ atoms/$cm^3$. This range of dopant concentration will result in a dopant surface concentration in the object substrate upon completion of the diffusion process of from about $5 \times 10^{16}$ to about $5 \times 10^{19}$ atoms/$cm^3$.

Any of the P-type and N-type dopants can be diffused into a III-V type object substrate in accordance with the invention. In addition to zinc which has already been mentioned, other P-type dopants which can be used herein include cadmium, beryllium, and the like; N-type dopants which can be used in the invention with good results include silicon (Si), tellurium (Te), selenium (Se) and sulfur (S).

The composition of the object substrate is discussed above; like the deposition substrate, it is frequently provided as a wafer with dimensions about the same as those of the latter substrate. It is preferred that the deposition substrate have a slightly larger surface area to insure complete doping of the surface of the object substrate. As previously noted, GaAs is the preferred III–V type material for the object substrate.

In the initial step of the diffusion process herein, the deposition substrate is placed in a heating furnace or chamber in contact with, or in proximity to, the object substrate with the dopant-containing layer of the deposition substrate facing, or opposed to, a major surface of the object substrate with their centers aligned along a common axis. The two substrates can be in contact with each other or they can be separated by a relatively short distance, e.g., from about 0.1 to about 10 millimeters or so. Any convenient number of pairs of deposition and diffusion substrates can be simultaneously subjected to the diffusion process of this invention.

The diffusion process is carried out in a chemically benign environment, i.e., one which is substantially devoid of oxygen or other oxidizing substances. This can be accomplished by evacuating the furnace or chamber in which diffusion takes place or, preferably, by sweeping the furnace or chamber with an inert gas such as nitrogen, helium or argon to remove any oxygen or other oxidant which may be initially present therein.

In the next step of the process, there is introduced into the heating chamber a substance which provides a Group V element corresponding to the Group V element of the object substrate at the diffusion temperature. The purpose of this substance is, as previously stated, to preserve the composition of the surface of the object substrate when the latter is heated to the diffusion temperature. Thus, for example, when the object substrate is GaAs, the substance selected for preserving the surface composition of the GaAs will be one which provides vapor phase As at the diffusion temperature.

One As-containing substance which has been found to be particularly useful herein is arsine ($AsH_3$) which decomposes at or before the diffusion temperature is reached to provide a mixture of gases made up of minor quantities of monoatomic and diatomic arsenic (As and $As_2$, respectively), and a major quantity of tetraatomic arsenic ($As_4$). While diffusion can be carried out in a vacuum, it is preferred to conduct it in the presence of a non-oxidizing carrier gas such as nitrogen or hydrogen, the latter being preferred as it will tend to reduce any oxide which may be present on the surface of the deposition and/or object substrate. When the vapor pressure of the Group V element present in the atmosphere of the diffusion environment is equal to or greater than the equilibrium vapor pressure of the Group V element tending to leave the surface of the object substrate at the diffusion temperature selected, there will be no appreciable net loss of Group V element from the object substrate and therefore the surface composition of the latter will remain substantially the same throughout the diffusion process. Typical vapor pressure fractions for the protective vapor phase Group V element can vary from as low as about 0.1% at relatively low diffusion temperatures to as high as about 5% or even higher at relatively high diffusion temperatures. The following table lists a variety of Group V substances which can be used herein:

TABLE I

Group V Element-containing Substances Useful for Preserving the Surface Composition of the Object Substrate at Diffusion Conditions

| Object Substrate | Group V Element-containing substance |
| --- | --- |
| GaAs, InAs, GaInAs, | arsine, triethyl arsine, triphenyl arsine |
| GaAlSb, GaSb | trimethyl stibine, triethyl stibine, triphenyl stibine |
| InP, GaInP, GaP | phosphine, triethyl phosphine, triphenyl phosphine |

The temperatures at which diffusion can be carried out in accordance with the invention are themselves known in the art and can vary widely, for example, from about 500° C. to about 800° C., and preferably from about 550° C. to about 750° C., for P-type dopants and from about 700° C. to about 1100° C., and preferably from about 750° C. to about 1050° C., for N-type dopants. The rate of diffusion is exponential: For P-type dopants, maintaining the diffusion temperature for from about 2 to about 60 minutes, and for N type dopants, maintaining the diffusion temperature for from about 10 to about 120 minutes (or longer if necessary) will generally result in diffusion of about one half the amount of dopant originally present in the deposition substrate into the object substrate.

The following examples are illustrative of the diffusion process of the present invention:

EXAMPLE 1

A. Preparation of Zinc-doped GaAs Deposition Substrate

A gallium arsenide wafer was provided with a zinc dopant-containing gallium arsenide layer grown upon one of its major surfaces employing a conventional metal-organic chemical vapor deposition (MOCVD) system. The gallium arsenide wafer was placed on a carbon susceptor which was positioned in a quartz tube surrounded by an RF coil. The following mixture of gases at ambient temperature (except where indicated) was introduced into the tube:

| Gas | Flow Rate ($cm^3$/min.) |
| --- | --- |
| hydrogen | 3000 |
| trimethyl gallium | 4.0 |
| arsine | 20.0 |
| diethyl zinc (4–5° C.) | 1.2 |

The contents of the tube were heated to 650° C. for 10 minutes 0 e having a providing a zinc-doped deposition substrate having a thickness of 0.83 micron, a sheet resistivity of 74.9 ohms per square, a Hall mobility of 75, a sheet carrier density of $1.11 \times 10^{15}$ per $cm^2$, and a carrier density of $1.34 \times 10^{19}$ per $cm^3$.

B. Diffusion of Zinc Into a GaAs Object Substrate

The zinc-doped deposition substrate obtained above was placed face down upon a gallium arsenide object substrate of the same diameter and the resulting "sandwich" was placed in a diffusion furnace or chamber having a single heating zone. Following sweeping of the furnace with nitrogen gas there was introduced into the furnace a gaseous mixture of 1,000 cm$^3$/min. hydrogen and 5 cm$^3$/min. arsine. The furnace was heated to 650° C. and maintained at this, the diffusion temperature, for 10 minutes. Following diffusion, the furnace was cooled to room temperature, the gaseous contents were swept out in a stream of nitrogen gas and a zinc-doped P-type gallium arsenide semiconductor having the following diffused region characteristics was removed:

| Property | Value |
| --- | --- |
| Diffusion Thickness (microns) | |
| Sheet Resistivity (ohms/square) | 123 |
| Sheet Carrier Density (carriers/cm$^2$) | $9.0 \times 10^{14}$ |
| Mobility (cm$^2$/volt second) | 56 |
| Doping Level (atoms/cm$^3$ of diffusion layer) | $7.5 \times 10^{18}$ |

The object substrate could, if desired, be reused by stripping the grown layer employing conventional procedures and growing a new layer of dopant-containing material.

Similarly, a gallium arsenide object substrate was placed on the carbon susceptor used to grow the deposition substrate. The carbon susceptor was coated with a Zn-doped polycrystalline layer automatically while the epitaxial layer is grown on the gallium arsenide substrate which sits on this susceptor during growth. This object substrate was then diffused at 650° C. for 10 minutes. The resulting diffused region characteristics were as follows: sheet resistivity 192 ohms/square, sheet carrier density $5.8 \times 10^{14}$ carriers per cm$^2$, mobility 56 cm$^2$/volt second, and doping level $4.8 \times 10^{18}$ carriers per cm$^3$.

EXAMPLES 2-6

Employing similar procedures as described above, additional diffusions were carried out in accordance with the present invention employing a GaAs deposition substrate and a GaAs object substrate (except where indicated). The results are set forth in Tables II and III as follows (These tables include the first example given above):

TABLE II

| | Deposition Substrate Grown Layer[1] | | |
| --- | --- | --- | --- |
| Example | Temp. °C. | Time (min.) | Diethyl Zinc cm/3 |
| 1 | 650 | 10 | 1.2 C.[2] |
| 2 | 650 | 10 | 4.0[2] |
| 3 | 720 | 10 | 1.2[3] |
| 4 | 650 | 30 | 2.0[3] |
| 5 | 600 | 25 | |
| 6[4] | 625 | 15 | 4.0[3] |

[1]Hydrogen: 3000 cm$^3$/min. Trimethyl gallium: 4.0 cm$^3$/min. Arsine: 20.0 cm$^3$/min.
[2]Cooled to about 4-5° C.
[3]Ambient temperature.
[4]Layer characteristics where sheet resistivity = 28.4 ohms/square, sheet carrier density = $5.2 \times 10^{15}$/cm$^2$, mobility = 43 and doping level = $4.7 \times 10^{19}$/cm$^3$.

TABLE III

| | Characteristics of Doped Object Substrate | | | | |
| --- | --- | --- | --- | --- | --- |
| Exs. | Diffusion Thickness (microns) | Sheet Resistivity (ohms/sq.) | Sheet Carrier Density (carrier/cm$^2$) | Mobility (cm$^2$/volt second) | Doping Level (atoms/cm$^3$ diffusion layer) |
| 1A | 1.2 | 123[1] | $9.0 \times 10^{14}$ | 56 | $7.5 \times 10^{18}$ |
| 1B | 1.2 | 192[2] | $5.8 \times 10^{14}$ | 56 | $4.8 \times 10^{18}$ |
| 2 | 0.75 | 178 | $6.53 \times 10^{14}$ | 54 | $8.8 \times 10^{18}$ |
| 4A | | 76 | $2.2 \times 10^{15}$ | 37.5 | $4.2 \times 10^{19}$ |
| 4B | | 89 | $1.3 \times 10^{15}$ | 54 | $3.4 \times 10^{19}$ |
| 6A | 0.5 | 80 | $1.19 \times 10^{15}$ | 66.5 | $2.4 \times 10^{19}$ |
| 6B | 0.65 | 70.2 | $1.62 \times 10^{15}$ | 55.6 | $2.5 \times 10^{19}$ |

[1]Deposition Substrate = GaAs.
[2]Deposition Substrate = Carbon susceptor

What is claimed is:

1. A process for diffusing a dopant into a III–V type semiconductor body which comprises:
   (a) placing in a heating chamber which is substantially devoid of any oxidizing substance a deposition substrate possessing a dopant-containing layer which has been vapor deposited upon a major surface thereof in contact with, or in the proximity of, an object substrate fabricated from a III–V type semiconductor material with the dopant-containing layer of the deposition substrate being substantially opposed to a major surface of the object substrate;
   (b) introducing into the heating chamber a source of Group V element corresponding to the Group V element of the object substrate, said source being capable of providing Group V element in the vapor phase at the diffusion temperature with the vapor pressure of the vapor phase Group V element being at or above the equilibrium vapor pressure of the Group V element present at the surface of the object substrate; and
   (c) heating the deposition substrate and the object substrate to the diffusion temperature for a period of time sufficient to diffuse a predetermined amount of dopant into the object substrate to a predetermined depth therein.

2. The process of claim 1 in which the deposition substrate and the object substrate are both provided as wafers with the diameter of the deposition substrate being the same as or slightly larger than the object substrate.

3. The process of claim 1 wherein the III–V type semiconductor material of the object substrate is GaAs.

4. The process of claim 3 wherein the deposition substrate is GaAs having a dopant-containing layer of GaAs vapor deposited thereon.

5. The process of claim 3 wherein the vapor phase group V material is arsenic derived from arsine.

6. The process of claim 1 wherein the dopant is a P-type impurity.

7. The process of claim 5 wherein the dopant is zinc.

8. The process of claim 6 wherein the diffusion temperature is in the range of from about 500° C. to about 800° C.

9. The process of claim 8 wherein the diffusion temperature is in the range of from about 550° C. to about 750° C.

10. The process of claim 6 wherein heating at the diffusion temperature is carried out for from about 2 to about 60 minutes.

11. The process of claim 1 wherein the dopant is an N-type impurity.

12. The process of claim 11 wherein the dopant is silicon.

13. The process of claim 11 wherein the diffusion temperature is in the range of from about 700° C. to about 1100° C.

14. The process of claim 13 wherein the diffusion temperature is in the range of from about 750° C. to about 1050° C.

15. The process of claim 11 wherein heating at the diffusion temperature is carried out for from about 10 to about 120 minutes.

16. The process of claim 1 wherein the dopant-containing layer is from about 1 to about 5 microns in thickness.

17. The process of claim 1 wherein the concentration of dopant in said dopant-containing layer is from about $10^{17}$ to about $10^{20}$ atoms per cubic centimeter of said layer.

18. The process of claim 17 wherein the surface concentration of dopant in the object substrate following diffusion is from about $5 \times 10^{16}$ to about $5 \times 10^{19}$ atoms per cubic centimeter of said layer.

19. The process of claim 1 wherein the heating chamber is evacuated of ambient atmosphere prior to heating to the diffusion temperature.

20. The process of claim 1 wherein the heating chamber is swept free of ambient atmosphere with an inert gas prior to heating to the diffusion temperature.

21. The process of claim 20 wherein the inert gas is nitrogen.

22. The process of claim 1 wherein the vapor phase Group V element has a vapor phase pressure fraction of from about 0.1% to about 5%.

* * * * *